(12) United States Patent
Higashi et al.

(10) Patent No.: US 10,424,384 B2
(45) Date of Patent: Sep. 24, 2019

(54) SEMICONDUCTOR MEMORY DEVICE AND CONTROL METHOD OF SEMICONDUCTOR MEMORY DEVICE

(71) Applicant: TOSHIBA MEMORY CORPORATION, Tokyo (JP)

(72) Inventors: Yusuke Higashi, Zushi Kanagawa (JP); Tomoya Sanuki, Suzuka Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/114,182

(22) Filed: Aug. 27, 2018

(65) Prior Publication Data

US 2019/0267097 A1 Aug. 29, 2019

(30) Foreign Application Priority Data

Feb. 23, 2018 (JP) .................................. 2018-030233

(51) Int. Cl.
| | |
|---|---|
| *G11C 11/34* | (2006.01) |
| *G11C 16/26* | (2006.01) |
| *H01L 27/102* | (2006.01) |
| *G11C 11/56* | (2006.01) |
| *G11C 16/04* | (2006.01) |
| *H01L 27/11582* | (2017.01) |

(52) U.S. Cl.
CPC .......... *G11C 16/26* (2013.01); *G11C 11/5671* (2013.01); *G11C 16/0483* (2013.01); *H01L 27/1027* (2013.01); *H01L 27/11582* (2013.01)

(58) Field of Classification Search
CPC . G11C 16/26; G11C 11/5671; G11C 16/0483; H01L 27/1027; H01L 27/11582

USPC .......... 365/185.18, 185.05, 185.24
See application file for complete search history.

(56) References Cited

U.S. PATENT DOCUMENTS

| | | | |
|---|---|---|---|
| 8,432,732 B2* | 4/2013 | Li | G11C 29/02 365/185.02 |
| 8,730,722 B2* | 5/2014 | Koh | G11C 11/5628 365/185.03 |
| 9,312,021 B2* | 4/2016 | Lee | H01L 27/1157 |
| 9,665,426 B2 | 5/2017 | Chen et al. | |
| 9,734,916 B2* | 8/2017 | Lee | G11C 16/26 |
| 2015/0348639 A1 | 12/2015 | Lee et al. | |
| 2016/0005479 A1 | 1/2016 | Lee et al. | |
| 2017/0194057 A1 | 7/2017 | Lee et al. | |
| 2018/0204624 A1* | 7/2018 | Yoon | G11C 16/28 |

* cited by examiner

*Primary Examiner* — Viet Q Nguyen
(74) *Attorney, Agent, or Firm* — Kim & Stewart LLP

(57) ABSTRACT

A semiconductor memory device includes an n-type semiconductor region, first to fourth conductive layers above the n-type semiconductor region, a p-type semiconductor region, a semiconductor layer between the n-type semiconductor region and the p-type semiconductor region and extending through the conductive layers, charge storage regions between the conductive layers and the semiconductor layer, a control circuit that executes a first read sequence and a second read sequence following the first read sequence, a comparison circuit that compares the first data read in the first read sequence to the second data read in the second read sequence, and a determination circuit that selects one of the first data and the second data as a true read value. The first and second read sequences each have an off step and an off voltage applied during the first read sequence is different from an off voltage applied during the second read sequence.

20 Claims, 14 Drawing Sheets

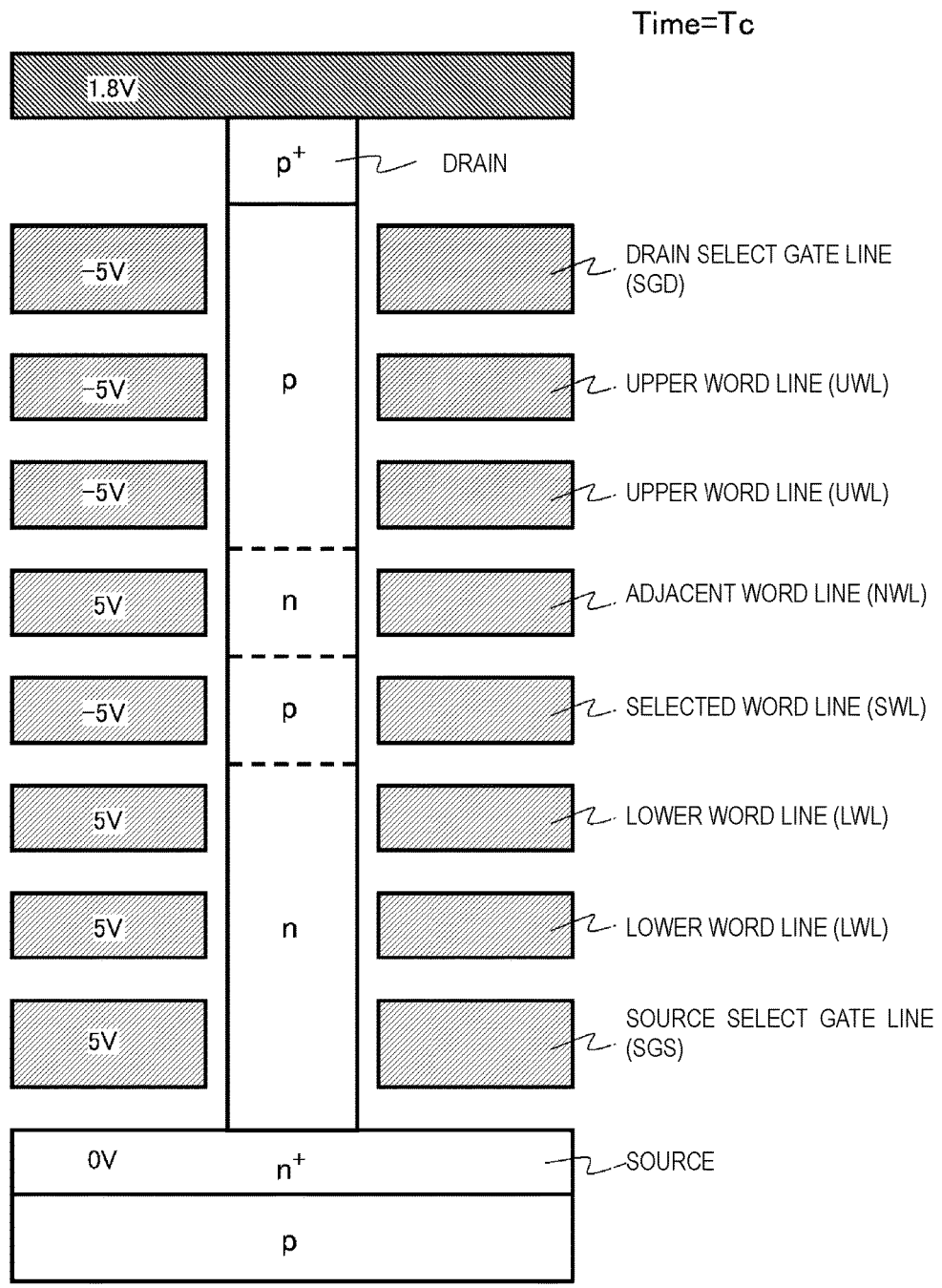

SEMICONDUCTOR MEMORY DEVICE AND CONTROL METHOD OF SEMICONDUCTOR MEMORY DEVICE

CROSS-REFERENCE TO RELATED APPLICATION

This application is based upon and claims the benefit of priority from. Japanese Patent Application No. 2018-030233, filed Feb. 23, 2018, the entire contents of which are incorporated herein by reference.

FIELD

Embodiments described herein relate generally to a semiconductor memory device and a control method of the semiconductor memory device.

BACKGROUND

In a three-dimensional NAND flash memory in which memory cells are three-dimensionally arranged, a high degree of integration and a low cost are achieved. In order to improve a read characteristic of the three-dimensional NAND flash memory, a positive feedback-type three-dimensional NAND flash memory is suggested in which a p-type semiconductor region is provided at one end of a memory string. In the positive feedback-type three-dimensional NAND flash memory, a memory cell transistor has a steep subthreshold slope, resulting in an improvement of a read characteristic. In order to achieve an even higher performance of the three-dimensional NAND flash memory, it would be desirable to achieve further improvements in the read characteristic of the positive feedback-type three-dimensional NAND flash memory.

DESCRIPTION OF THE DRAWINGS

FIG. 6 is a schematic view for explaining the read sequence of data in the first embodiment.

DETAILED DESCRIPTION

Figure 1:
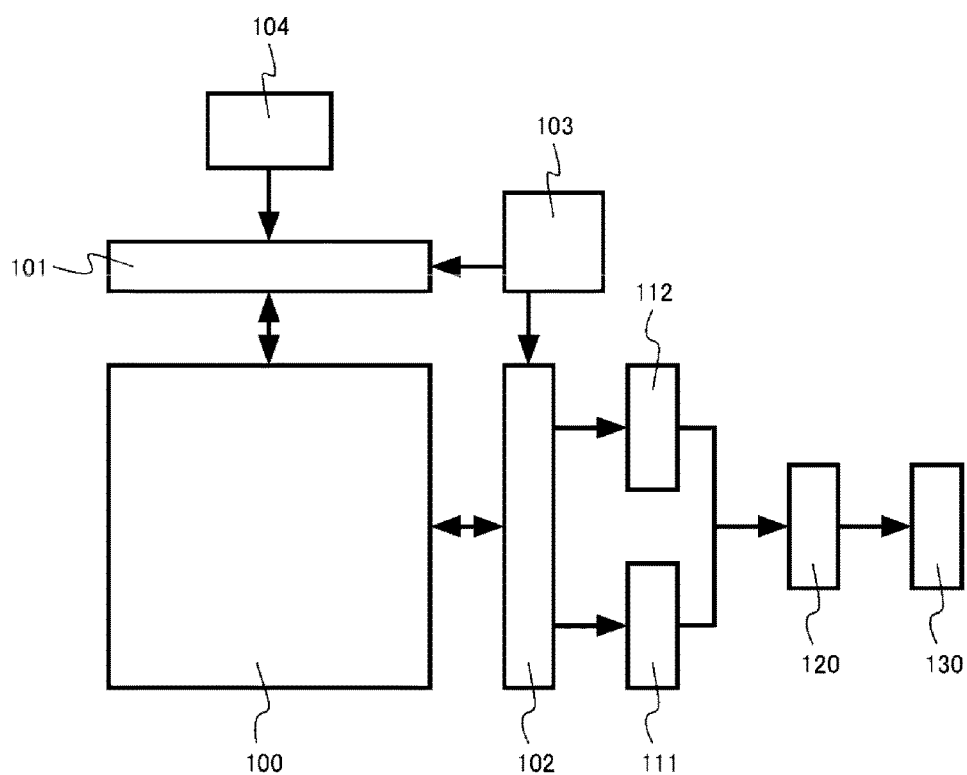
FIG. 1 is a block diagram of a semiconductor memory device according to a first embodiment.

An embodiment provides a semiconductor memory device in which a read characteristic can be improved.

In general, according to one embodiment, a semiconductor memory device includes an n-type semiconductor region, a first conductive layer above the n-type semiconductor region, a second conductive layer above the first conductive layer, a third conductive layer above the second conductive layer, a fourth conductive layer above the third conductive layer, a p-type semiconductor region closer to the fourth conductive layer than the n-type semiconductor region, and a semiconductor layer that extends through the first conductive layer, the second conductive layer, the third conductive layer, and the fourth conductive layer, is between the n-type semiconductor region and the p-type semiconductor region, and has an n-type impurity concentration lower than an n-type impurity concentration of the n-type semiconductor region and a p-type impurity concentration lower than a p-type impurity concentration of the p-type semiconductor region. The semiconductor memory device further includes a first charge storage region between the first conductive layer and the semiconductor layer, a second charge storage region between the second conductive layer and the semiconductor layer, a third charge storage region between the third conductive layer and the semiconductor layer, a fourth charge storage region between the fourth conductive layer and the semiconductor layer, a voltage control circuit configured to control voltages to be applied to the first conductive layer, the second conductive layer, the third conductive layer, and the fourth conductive layer, and to execute a first read sequence in which first data based on a charge amount in the second charge storage region is read, and a second read sequence, following the first read sequence, in which second data based on a charge amount in the second charge storage region is read, a comparison circuit configured to compare the first data to the second data, and a determination circuit configured to select one of the first data and the second data as a true read value based on a comparison result of the comparison circuit. Each of the first read sequence and the second read sequence has an off step during which an off voltage is applied to the second conductive layer, and a read step during which a read voltage higher than the off voltage is applied to the second conductive layer, and the off voltage of the first read sequence and the off voltage of the second read sequence are different.

Hereinafter, embodiments of the present disclosure will be described with reference to drawings. In the following description, the same or similar elements are denoted by the same reference numerals, and explanations the same of similar elements which were described once will not be repeated unless necessary.

In the present specification, for convenience, terms such as "upper" and "lower" may be used. The terms "upper" and "lower" merely indicate a relative positional relationship within a drawing, but does not define a positional relationship with respect to gravity.

In the present specification, it is assumed that "voltage" means a potential difference with respect to a ground potential unless otherwise defined.

First Embodiment

Figure 2:
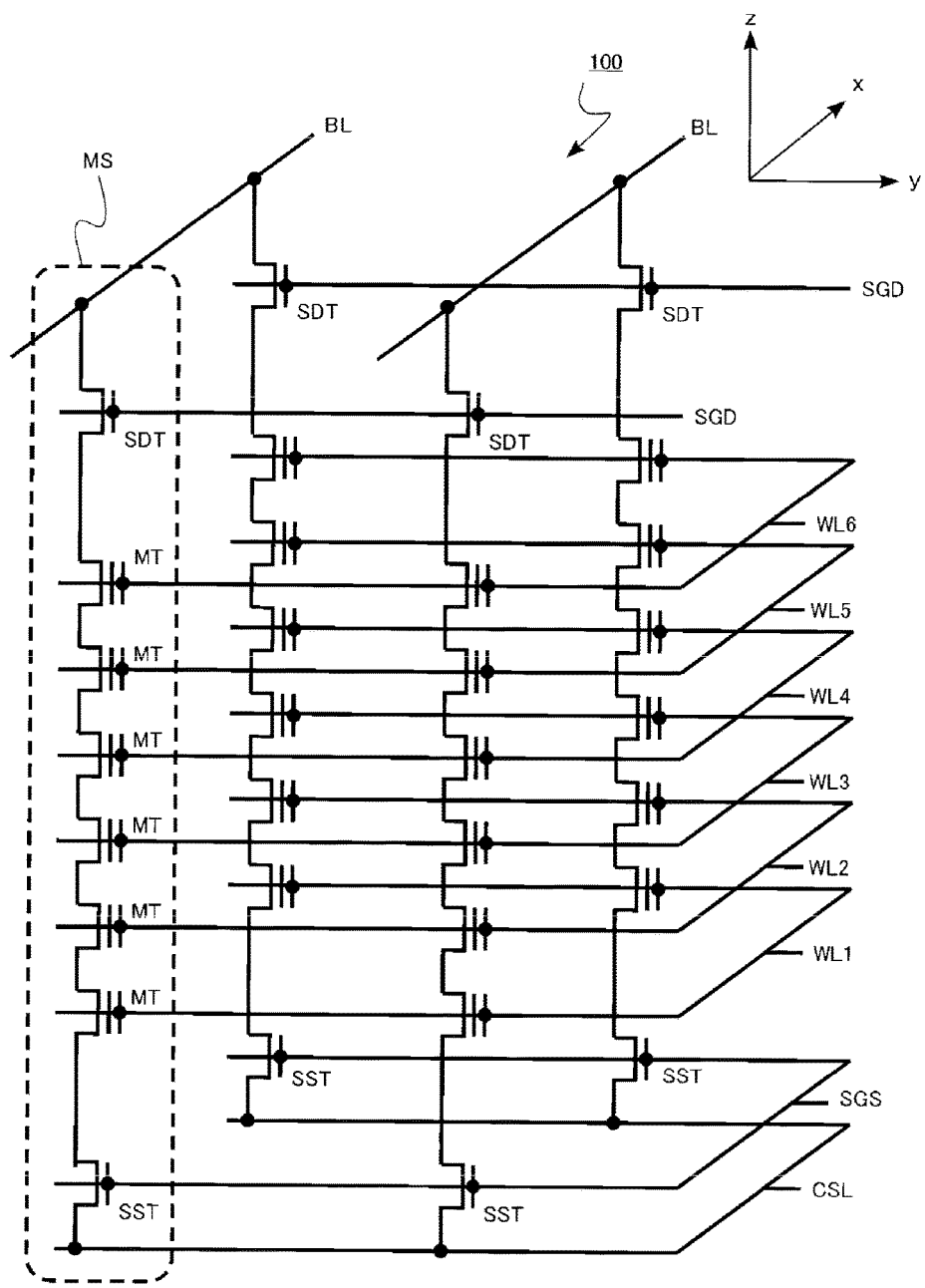
FIG. 2 is a circuit diagram of a memory cell array of the semiconductor memory device according to the first embodiment.
Figure 3:
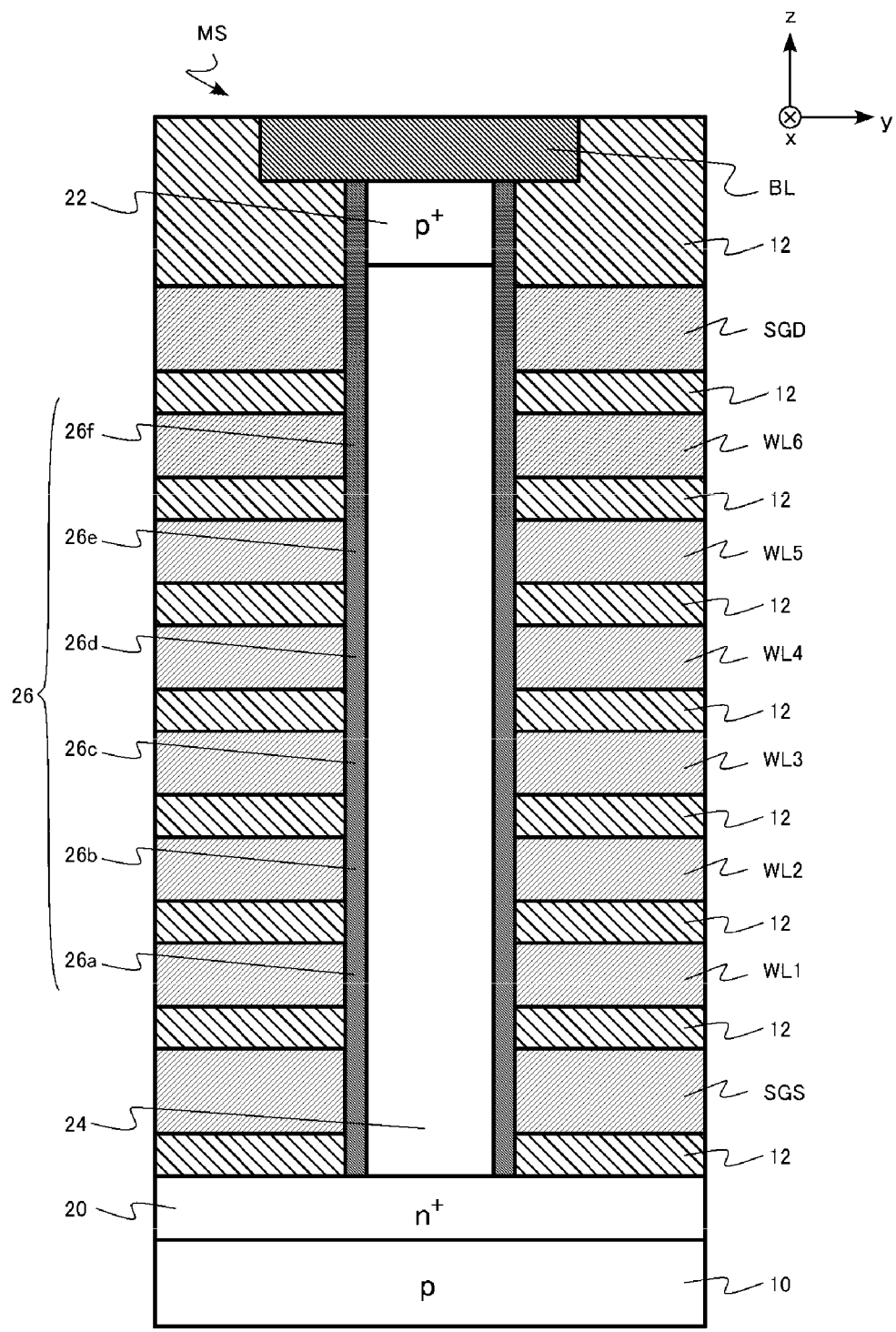
FIG. 3 is a schematic sectional view of a memory string of the semiconductor memory device according to the first embodiment.

FIG. 1 is a block diagram of a semiconductor memory device according to a first embodiment. FIG. 2 is a circuit diagram of a memory cell array 100 of the semiconductor memory device according to the first embodiment. FIG. 3 is a schematic sectional view of a memory string MS of the semiconductor memory device according to the first embodiment. FIG. 3 illustrates a section of one memory string MS, the section being indicated by a dotted line in the memory cell array 100 in FIG. 2.

The semiconductor memory device according to the first embodiment is a three-dimensional NAND flash memory in which memory cells are three-dimensionally arranged. The semiconductor memory device according to the first embodiment is a positive feedback type three-dimensional NAND flash memory in which a p-type semiconductor region is provided at one end of a memory string. The three-dimensional NAND flash memory according to the first embodiment is a multi-level memory in which a plurality of bits of data are stored in one memory cell transistor MT.

The three-dimensional NAND flash memory according to the first embodiment includes the memory cell array 100, a first control circuit 101, a second control circuit 102, a word line voltage control circuit 103, an off voltage generation circuit 104, a first memory 111, a second memory 112, a comparison circuit 120, and a determination circuit 130.

The memory cell array 100, as illustrated in FIG. 2, includes a word line WL1, a word line WL2, a word line WL3, a word line WL4, a word line WL5, a word line WL6, a common source line CSL, a source select gate line SGS, a plurality of drain select gate lines SGD, a plurality of bit lines BL, and a plurality of memory strings MS.

As illustrated in FIG. 2, each memory string MS includes a source select transistor SST, a plurality of memory cell transistors MT, and a drain select transistor SDT, which are connected in series between the common source line CSL and the bit line BL.

The memory cell array 100, as illustrated in FIG. 3, includes a semiconductor substrate 10, interlayer insulating layers 12, the first to sixth word lines WL1 to WL6, an n-type semiconductor region 20, a p-type semiconductor region 22, a semiconductor layer 24, a charge storage film 26, and the bit line BL. The charge storage film 26 includes a charge storage region 26a, a charge storage region 26b, a charge storage region 26c, a charge storage region 26d, a charge storage region 26e, and a charge storage region 26f.

The semiconductor substrate 10 is, for example, a monocrystalline p-type silicon substrate. The semiconductor substrate 10 contains, for example, boron (B) as a p-type impurity.

The word lines WL1 to WL6 are provided on the semiconductor substrate 10. The word lines WL1 to WL6 are plate-shaped conductive layers. The word lines WL1 to WL6 are stacked with the interlayer insulating layers 12 interposed between the word lines WL1 to WL6. The word lines WL1 to WL6 are stacked in the z direction. The word lines WL1 to WL6 function as control electrodes of the memory cell transistors MT.

The word lines WL1 to WL6 are made of polycrystalline silicon containing, for example, a conductive impurity. The word lines WL1 to WL6 are made of, for example, a metal. The interlayer insulating layers 12 are made of, for example, silicon oxide.

The n-type semiconductor region 20 is provided within the semiconductor substrate 10. The n-type semiconductor region 20 includes an n-type impurity. The n-type impurity is, for example, phosphorous (P) or arsenic (As). The n-type impurity concentration of the n-type semiconductor region 20 is, for example, $1\times10^{-19}$ cm$^{-3}$ or more. The n-type semiconductor region 20 functions as the common source line CSL. It is possible to provide the n-type semiconductor region 20 as a region independent from the semiconductor substrate 10.

The p-type semiconductor region 22 is closer to the word line WL6 than the n-type semiconductor region 20. The p-type semiconductor region 22 is present at the bit line BL side of the semiconductor layer 24.

The p-type semiconductor region 22 contains a p-type impurity. The p-type semiconductor region 22 is made of, for example, polycrystalline silicon containing a p-type impurity. The p-type impurity is, for example, boron (B). The p-type impurity concentration of the p-type semiconductor region 22 is, for example, $1\times10^{19}$ cm$^{-3}$ or more.

The semiconductor layer 24 is provided between the n-type semiconductor region 20 and the p-type semiconductor region 22. The semiconductor layer 24 is in contact with the n-type semiconductor region 20 and the p-type semiconductor region 22. The semiconductor layer 24 extends through the first to sixth word lines WL1 to WL6. The semiconductor layer 24 extends in the z direction. The semiconductor layer 24 has, for example, a columnar shape or a cylindrical shape. The semiconductor layer 24 is surrounded by the first to sixth word lines WL1 to WL6.

The semiconductor layer 24 is made of, for example, polycrystalline silicon. The n-type impurity concentration of the semiconductor layer 24 is lower than the n-type impurity concentration of the n-type semiconductor region 20. The p-type impurity concentration of the semiconductor layer 24 is lower than the p-type impurity concentration of the p-type semiconductor region 22. The n-type impurity concentration and the p-type impurity concentration of the semiconductor layer 24 are, for example $1\times10^{17}$ cm$^{-3}$ or less. The semiconductor layer 24 is, for example, an intrinsic semiconductor.

The charge storage film 26 is provided between the word lines WL1 to WL6 and the semiconductor layer 24. The charge storage film 26 has a function of accumulating charges inside the charge storage film 26 according to an electric field applied to the charge storage film 26. It is also possible to apply and erase charges accumulated inside the charge storage film 26 to and from the charge storage film 26 in stages.

The charge storage film 26 has a stacked structure of, for example, a silicon oxide film, a silicon nitride film, and a silicon oxide film. The charge storage film 26 accumulates, for example, electrons within the silicon nitride film.

The charge storage region 26a is provided between the word line WL1 and the semiconductor layer 24. The charge storage region 26b is provided between the word line WL2 and the semiconductor layer 24. The charge storage region 26c is provided between the word line WL3 and the semiconductor layer 24. The charge storage region 26d is provided between the word line WL4 and the semiconductor layer 24. The charge storage region 26e is provided between the word line WL5 and the semiconductor layer 24. The charge storage region 26f is provided between the word line WL6 and the semiconductor layer 24.

Each memory cell transistor MT includes a word line, a charge storage region, and the semiconductor layer 24. For example, the memory cell transistor MT includes the word line WL3, the charge storage region 26c, and the semiconductor layer 24. The memory cell transistor MT has a function of holding data based on a charge amount in its charge storage region.

Data held in the memory cell transistor MT is represented by, for example, a threshold voltage of the memory cell transistor. The memory cell transistor MT is capable of storing, for example, a plurality of bits of data. The memory cell transistor MT is capable of storing, for example, three or more threshold voltages.

The bit line BL is electrically connected to the p-type semiconductor region 22. The bit line BL is in contact with, for example, the p-type semiconductor region 22. The bit line BL has a function of transferring data read from the memory cell transistor MT. The bit line BL has a function of transferring data to be written to the memory cell transistor MT. The bit line BL is made of, for example, a metal.

The source select transistor SST has a function of selecting the memory string MS based on a signal applied to the source select gate line SGS. The drain select transistor SDT has a function of selecting the memory string MS based on a signal applied to the drain select gate line SGD.

For example, a ground potential is applied to the common source line CSL.

The first control circuit 101 is connected to the word lines WL1 to WL6. The first control circuit 101 has a function of selecting a desired line of the word lines WL1 to WL6. The first control circuit 101 has a function of applying a command voltage to the selected word line.

The second control circuit 102 is connected to the plurality of bit lines BL. The second control circuit 102 has a function of selecting a desired bit line BL. The second control circuit 102 has a function of sensing data of the memory cell transistor MT read from the selected bit line BL. The second control circuit 102 has a function of transmitting predetermined data to be written to the memory cell transistor MT, to the selected bit line BL.

The word line voltage control circuit 103 has a function of controlling a voltage to be applied to the word lines WL1 to WL6. The word line voltage control circuit 103 has a function of executing a first read sequence for the memory cell transistor MT, and a second read sequence different from the first read sequence. Based on a command from the word line voltage control circuit 103, the first control circuit 101 applies a voltage to the selected word line.

The first read sequence and the second read sequence have an off step including application of an off voltage to a word line, and a read step including application of a read voltage higher than the off voltage to the word line. In addition, the off voltage in the first read sequence and the off voltage in the second read sequence have different values.

The voltage generation circuit 104 has a function of generating an off voltage to be applied to the word lines WL1 to WL6. The off voltage generation circuit 104 generates a plurality of voltages at different levels. The off voltage generation circuit generates a negative voltage, or both a negative voltage and a positive voltage. The off voltage generation circuit 104 is, for example, a step-up circuit or a step-down circuit.

The first memory 111 has a function of storing data of the memory cell transistor MT. The data of the memory cell transistor MT is based on a charge amount in its charge storage region. The data is represented by, for example, a threshold voltage of the memory cell transistor MT. The first memory 111 stores first data of the memory cell transistor MT read in the first read sequence.

The second memory 112 has a function of storing data of the memory cell transistor MT. The data is based on a charge amount in a charge storage region of the memory cell transistor MT. The data is represented by, for example, a threshold voltage of the memory cell transistor MT. The second memory 112 stores second data of the memory cell transistor MT read in the second read sequence.

The comparison circuit 120 has a function of comparing first data stored in the first memory 111, to second data stored in the second memory 112. The determination circuit 130 has a function of determining which one of the first data and the second data is a true value, based on the comparison result of the comparison circuit 120.

The first control circuit 101, the second control circuit 102, the word line voltage control circuit 103, the off voltage generation circuit 104, the first memory 111, the second memory 112, the comparison circuit 120, and the determination circuit 130 includes, for example, electronic circuits using semiconductor devices formed on the semiconductor substrate 10.

Figure 4:
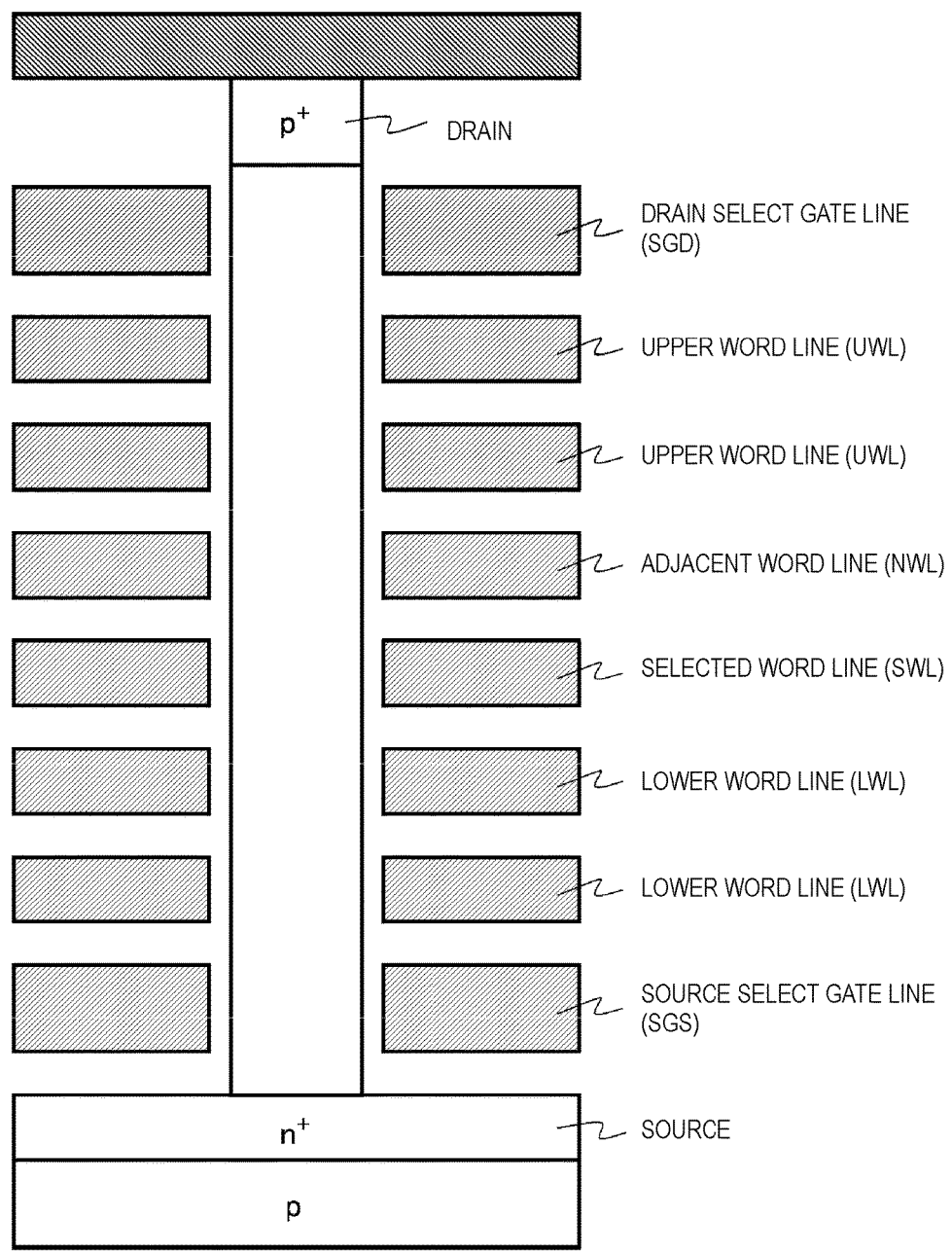
FIG. 4 is a schematic view for explaining a read sequence of data in the first embodiment.
Figure 5A:
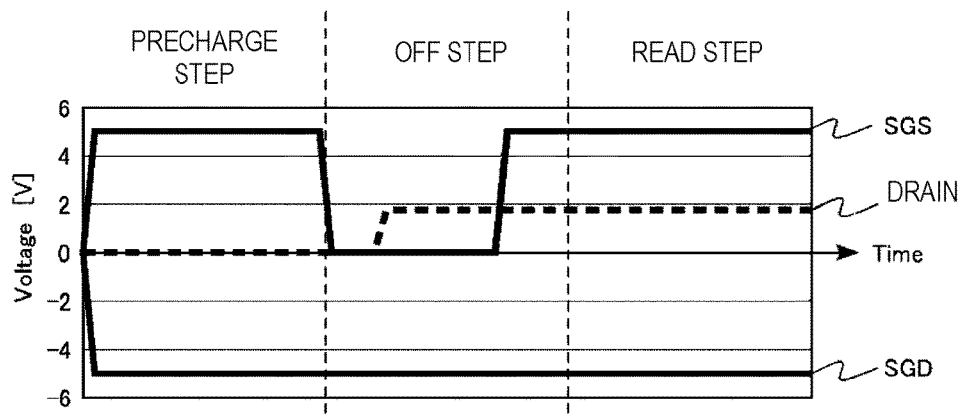
FIG. 5A to 5C are timing charts of the read sequence of data in the first embodiment.
Figure 5B:
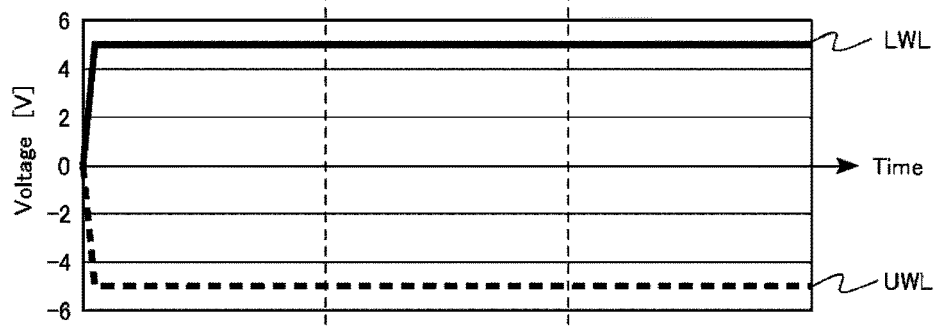
Figure 5C:
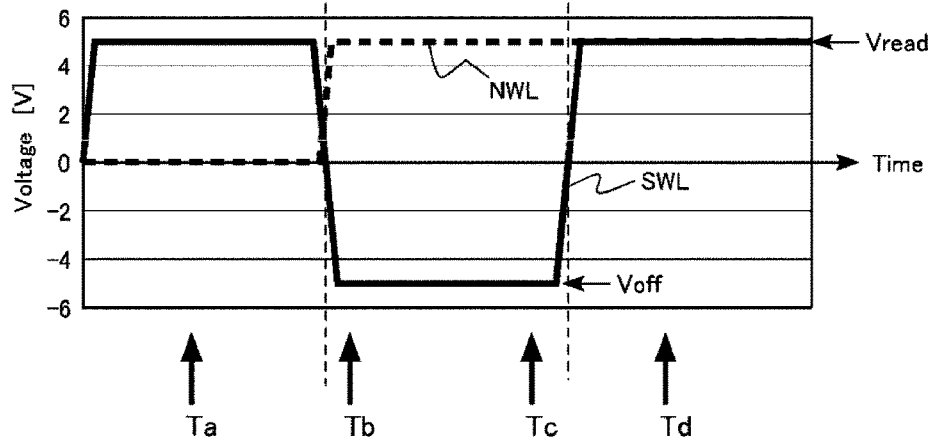

Hereinafter, descriptions will be made on a basic operation of the three-dimensional NAND flash memory according to the first embodiment. FIG. 4 is a schematic view for explaining a read sequence of data in the first embodiment. FIGS. 5A to 5C are timing charts of a read sequence of data in the first embodiment.

For ease of reference, FIG. 4 provides designations of each layer and each region. Hereinafter, a case where data of a memory cell transistor MT which is controlled by a selected word line SWL, is read will be described as an example. The selected word line SWL corresponds to the word line WL3 in FIG. 3. An adjacent word line NWL adjacent to the selected word line SWL corresponds to the word line WL4 in FIG. 3. Two lower word lines LWL correspond to the word line WL1 and the word line WL2 in FIG. 3. Two upper word lines UWL correspond to the word line WL5 and the word line WL6 in FIG. 3. A source corresponds to the n-type semiconductor region 20 in FIG. 3, and a drain corresponds to the p-type semiconductor region 22 in FIG. 3.

As illustrated in FIGS. 5A to 5C, the read sequence of reading data of the memory cell transistor MT includes a precharge step, an off step, and a read step.

FIG. 5A is a timing chart of the source select gate line SGS, the drain select gate line SGD, and the drain. FIG. 5B is a timing chart of the lower word line LWL, and the upper word line UWL. FIG. 5C is a timing chart of the selected word line SWL and the adjacent word line NWL. The source is always fixed at a ground potential, that is, 0 V.

The precharge step is a step of initializing the state of the memory cell transistor MT prior to the read sequence. By the precharge step, for example, instability of a read operation is eliminated.

In the precharge step (Ta in FIGS. 5A to 5C), a positive voltage is applied to the source select gate line SGS, the lower word line LWL, and the selected word line SWL. A negative voltage is applied to the drain select gate line SGD, and the upper word line UWL. A voltage of the adjacent word line NWL is 0 V. A voltage of the drain is 0 V.

In the precharge step, electrons are accumulated in the semiconductor layer 24 facing the source select gate line SGS, the lower word line LWL, and the selected word line SWL, and thus an n-type semiconductor is obtained. Holes are accumulated in the semiconductor layer 24 facing the drain select gate line SGD, and the upper word line UWL, and thus a p-type semiconductor is obtained.

The off step is a step of forming an energy barrier with respect to charges within the semiconductor layer 24. When the precharge step is shifted to the off step (Tb in FIGS. 5A to 5C), the voltage applied to the source select gate line SGS is lowered from the positive voltage to 0 V. The voltage applied to the selected word line SWL changes from the positive voltage to a negative voltage. The voltage applied to the adjacent word line NWL changes from 0 V to a positive voltage.

When the voltage applied to the selected word line SWL is set to the negative voltage, and the voltage applied to the adjacent word line NWL is set to the positive voltage, an energy barrier with respect to charges is formed in the semiconductor layer 24. The voltage applied to the selected word line SWL in the off step is called an off voltage Voff.

In the off step, after the energy barrier is formed in the semiconductor layer 24 (Tc in FIGS. 5A to 5C), the voltage applied to the drain is set to a positive voltage from 0 V. Thereafter, the voltage applied to the source select gate line SGS is set to a positive voltage from 0 V.

FIG. 6 is a schematic view for explaining the read sequence of data. FIG. 6 is a schematic sectional view illustrating an applied voltage and a state of the semiconductor layer 24 at time Tc of the off step. As illustrated in FIG. 6, when the voltage applied to the selected word line SWL is set to the negative voltage, holes are accumulated in the semiconductor layer 24 facing the selected word line SWL, and thus a p-type semiconductor is obtained. Meanwhile, when the voltage applied to the adjacent word line NWL is set to the positive voltage, electrons are accumulated in the semiconductor layer 24 facing the adjacent word line NWL, and thus an n-type semiconductor is obtained. Therefore, a thyristor structure of npnp is formed within the semiconductor layer 24 from the source toward the drain.

The read step is a step of reading data in the memory cell transistor MT. The voltage applied to the selected word line SWL is changed from the negative voltage to a positive voltage (Td in FIGS. 5A to 5C). An energy barrier with respect to electrons below the selected word line SWL is lowered so that a thyristor operation occurs and a current flows between the source and the drain. The voltage applied to the selected word line SWL in the read step is referred to as a read voltage Vread. The read voltage Vread is higher than the off voltage Voff.

Figure 7:
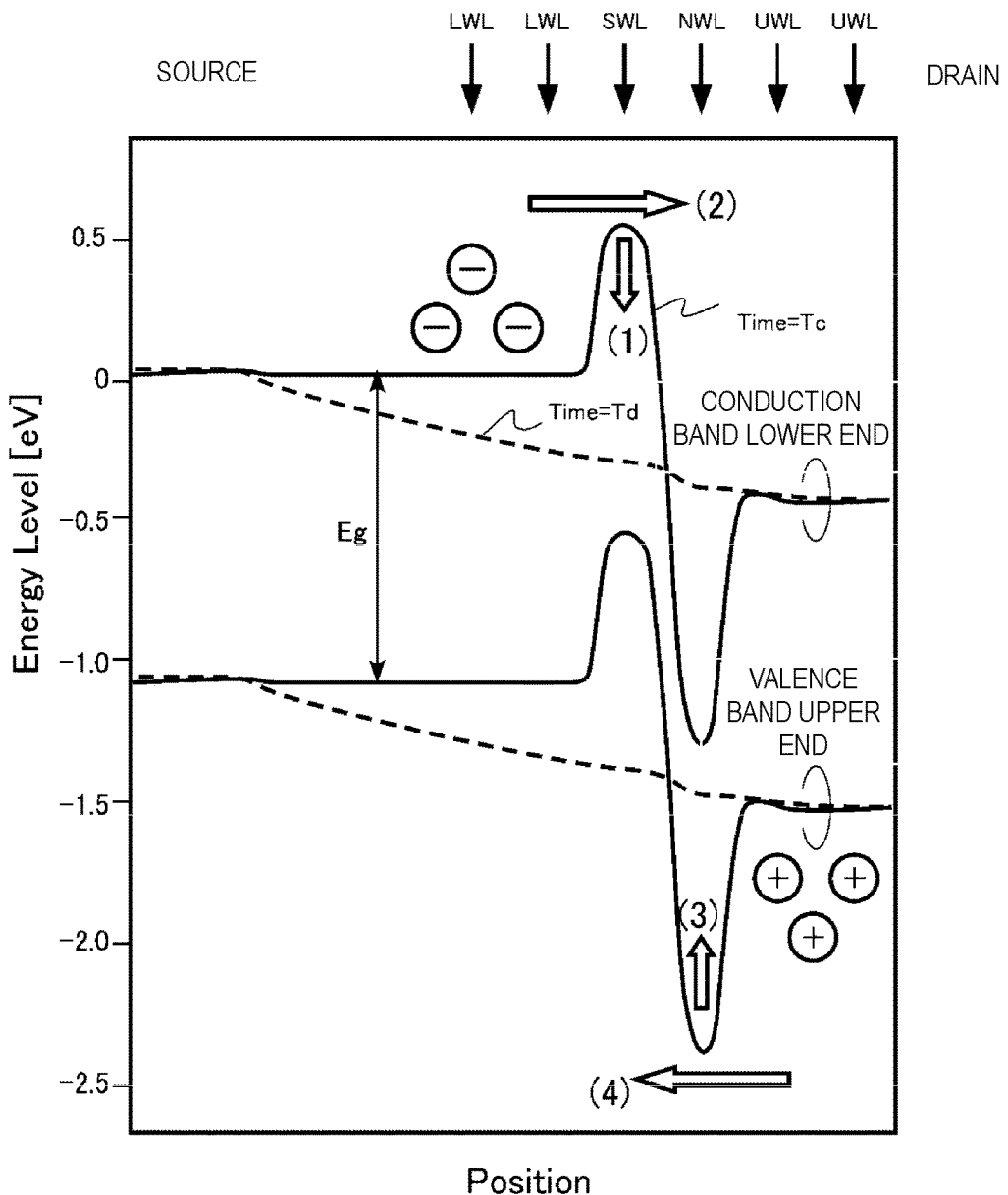
FIG. 7 is a band diagram for explaining the read sequence in the first embodiment.

FIG. 7 is a band diagram for explaining the read sequence in the first embodiment. FIG. 7 illustrates energy levels of a conduction band lower end and a valence band upper end at time Tc in the off step and at time Td in the read step (see FIGS. 5A to 5C). Eg in the drawing indicates a band gap energy.

At time Tc, since the negative voltage is applied to the selected word line SWL, an energy barrier with respect to electrons below the selected word line SWL is formed. Since the positive voltage is applied to the adjacent word line NWL, an energy barrier with respect to holes below the adjacent word line NWL is formed. Since the energy barriers with respect to electrons and holes are formed, even when a positive voltage is applied to the drain, a current does not flow.

At time Td, the voltage applied to the selected word line SWL rises from the negative voltage. Thus, an energy barrier with respect to electrons below the selected word line SWL is lowered (the arrow (1) in FIG. 7). Since the energy barrier with respect to electrons is lowered, electrons flow from the source toward the drain (the arrow (2) in FIG. 7). As the electrons flow, an energy barrier with respect to holes below the adjacent word line NWL is lowered (the arrow (3) in FIG. 7). Since the energy barrier with respect to holes is lowered, holes flow from the drain toward the source (the arrow (4) in FIG. 7).

According to the flow of the holes, the energy barrier with respect to electrons below the selected word line SWL is further lowered so that a positive feedback is applied and a current flowing between the drain and the source rapidly increases. That is, a thyristor operation occurs. Finally, at time Td, the energy barriers with respect to electrons and holes disappear and the current continuously flows.

Since the current flowing between the drain and the source rapidly increases, an S factor of the memory cell transistor MT decreases. Accordingly, a data read characteristic of the memory cell transistor MT is improved.

A threshold voltage at which a thyristor operation occurs is dependent on an amount of charges accumulated in the charge storage region of the memory cell transistor MT. When the amount of accumulated electrons is large, an energy barrier with respect to electrons below the selected word line SWL rises, and thus the threshold voltage rises. Meanwhile, when the amount of accumulated electrons is small, an energy barrier with respect to electrons below the selected word line SWL is lowered, and thus the threshold voltage is lowered.

By varying the amount of accumulated electrons in stages, the memory cell transistor MT is allowed to have a plurality of threshold voltages. The memory cell transistor MT is allowed to have the plurality of threshold voltages, and thus may store multiple bits.

Writing of data to the memory cell transistor MT may be achieved by maintaining a voltage of a word line with respect to, for example, the semiconductor layer 24, at a positive voltage, and injecting electrons from the semiconductor layer 24 to a charge storage region. By controlling a write voltage level of the word line, it is possible to control an amount of electrons injected into the charge storage region. This allows the memory cell transistor MT to have a plurality of threshold voltages.

Erasing of data from the memory cell transistor MT may be achieved by maintaining a voltage of the semiconductor layer 24 with respect to, for example, the word line, at a positive voltage, and drawing out electrons from the charge storage region to the semiconductor layer 24.

Hereinafter, descriptions will be made on a method of controlling the semiconductor memory device according to the first embodiment.

The method of performing a read operation on the semiconductor memory device according to the first embodiment includes the steps of executing a first read sequence in which first data based on a charge amount in the second charge storage region is read, and a second read sequence, following the first read sequence, in which second data based on a charge amount in the second charge storage region is read, comparing the first data to the second data, and selecting one of the first data and the second data as a true read value based on a comparison result of the comparison circuit. Each of the first read sequence and the second read sequence has an off step during which an off voltage is applied to the second conductive layer, and a read step during which a read voltage higher than the off voltage is applied to the second conductive layer, and the off voltage of the first read sequence and the off voltage of the second read sequence are different.

The method of controlling the semiconductor memory device according to the first embodiment is a method of controlling a semiconductor memory device according to the first embodiment as illustrated in FIG. 1. The method of controlling the semiconductor memory device according to the first embodiment is related to a method of reading data stored in a memory cell transistor MT.

First, for a specific memory cell transistor MT, a first read sequence is executed. For example, it is assumed that the word line WL3 in FIG. 3 is a selected word line SWL. In the first read sequence, first data of a memory cell transistor MT including the selected word line SWL as a control electrode, is read. In the first read sequence, first data based on a charge amount in the charge storage region 26c is read.

The first read sequence is the same as the read sequence illustrated in the timing charts of FIGS. 5A to 5C. The first read sequence includes a first precharge step, a first off step, and a first read step.

The first off step includes application of a first off voltage Voff1 to the word line WL3. The first off voltage Voff1 is a negative voltage. The first off voltage Voff1 is, for example, −5 V.

The first read step includes application of a first read voltage Vread1 to the word line WL3. The first read voltage Vread1 is a positive voltage. The first read voltage Vread1 is, for example, 5 V.

In the first read sequence, the voltages applied to the word lines WL1 to WL6 are controlled by the word line voltage control circuit 103.

The first data read in the first read sequence is stored in the first memory 111. The first data is, for example, a threshold voltage of the memory cell transistor MT.

Next, for the same memory cell transistor MT, a second read sequence is executed. In the second read sequence, second data based on a charge amount in the charge storage region 26c is read.

The second read sequence is also the same as the read sequence illustrated in the timing charts of FIGS. 5A to 5C. The second read sequence includes a second precharge step, a second off step, and a second read step.

The second off step includes an application of a second off voltage Voff2 to the word line WL3. The second off voltage Voff2 is a voltage having a value different from the first off voltage Voff1. For example, the second off voltage Voff2 is a voltage higher than the first off voltage Voff1. The second off voltage Voff2 is, for example, a negative voltage. The second off voltage Voff2 is, for example, −2 V.

The second off voltage Voff2 may also be, for example, 0 V or a positive voltage. The second off voltage Voff2 may be, for example, 1 V. In one example, at least one of the first off voltage Voff1 and the second off voltage Voff2 is a positive voltage.

Since, for example, the second off voltage Voff2 is set to a voltage higher than the first off voltage Voff1, an energy barrier with respect to electrons of the semiconductor layer 24 below the word line WL3 is lowered as compared to the first off voltage Voff1.

The second read step includes application of a second read voltage Vread2 to the word line WL3. The second read voltage Vread2 is the same as the first read voltage Vread1. The second read voltage Vread2 is, for example, 5 V.

In the second read sequence, the voltages applied to the word lines WL1 to WL6 are controlled by the word line voltage control circuit 103.

The second read sequence and the first read sequence are the same except that values of an off voltage Voff are different from each other.

The second data read in the second read sequence is stored in the second memory 112. The second data is, for example, a threshold voltage of the memory cell transistor MT.

Thereafter, the first data stored in the first memory 111 is compared to the second data stored in the second memory 112. The comparison between the first data and the second data is performed by the comparison circuit 120.

For example, it is assumed that the first data is a first threshold voltage, and the second data is a second threshold voltage. The comparison circuit 120 performs comparison to determine which one of the first threshold voltage and the second threshold voltage is higher.

Then, it is determined which one of the first data and the second data is a true value. The determination is performed by the determination circuit 130. For example, it is assumed that the first data is the first threshold voltage, and the second data is the second threshold voltage. The determination circuit 130 determines that a higher one of the first threshold voltage and the second threshold voltage is the true value.

Next, the operation and the effect of the first embodiment will be described.

In the three-dimensional NAND flash memory according to the first embodiment, as the amount of electrons accumulated in a charge storage region of a memory cell transistor MT increases, the threshold voltage of the memory cell transistor MT rises. This is because as the amount of electrons accumulated in the charge storage region increases, an energy barrier with respect to electrons just below a selected word line SWL rises.

However, according to observations of the inventor, when an amount of electrons accumulated in a charge storage region exceeds a certain amount, a rise of a threshold voltage of a memory cell transistor MT is saturated. Thus, when an amount of electrons exceeds a certain amount, it becomes more difficult to read a value of an assumed true threshold voltage. Accordingly, in a case of a multi-level memory, a problem occurs in that a region with a high threshold voltage may not be effectively utilized.

Figure 8A:
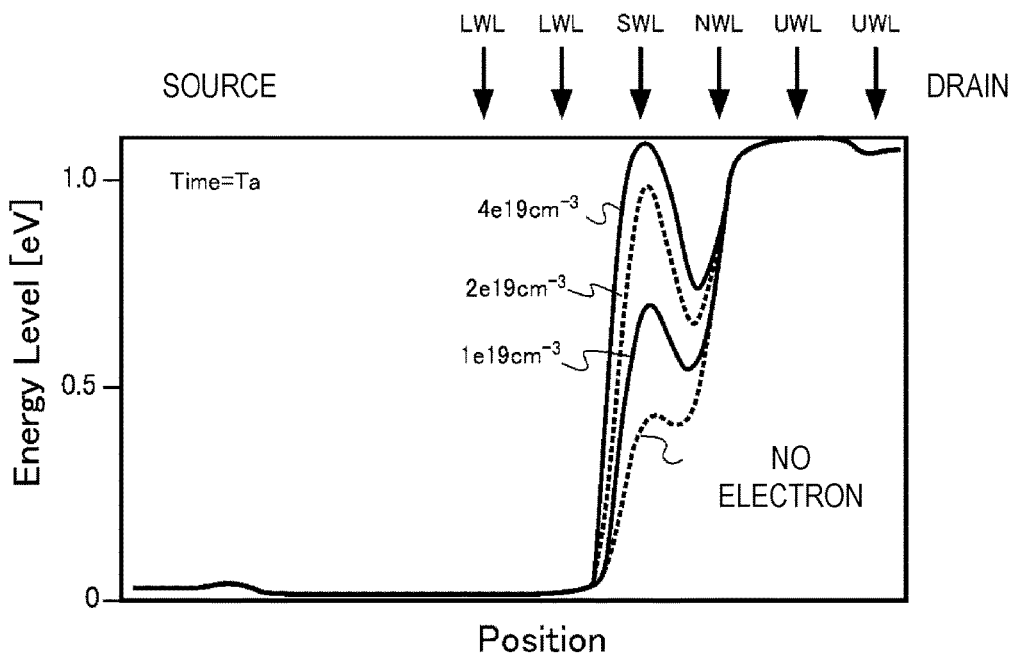
FIGS. 8A and 8B are explanatory views of an operation and an effect of the first embodiment.
Figure 8B:
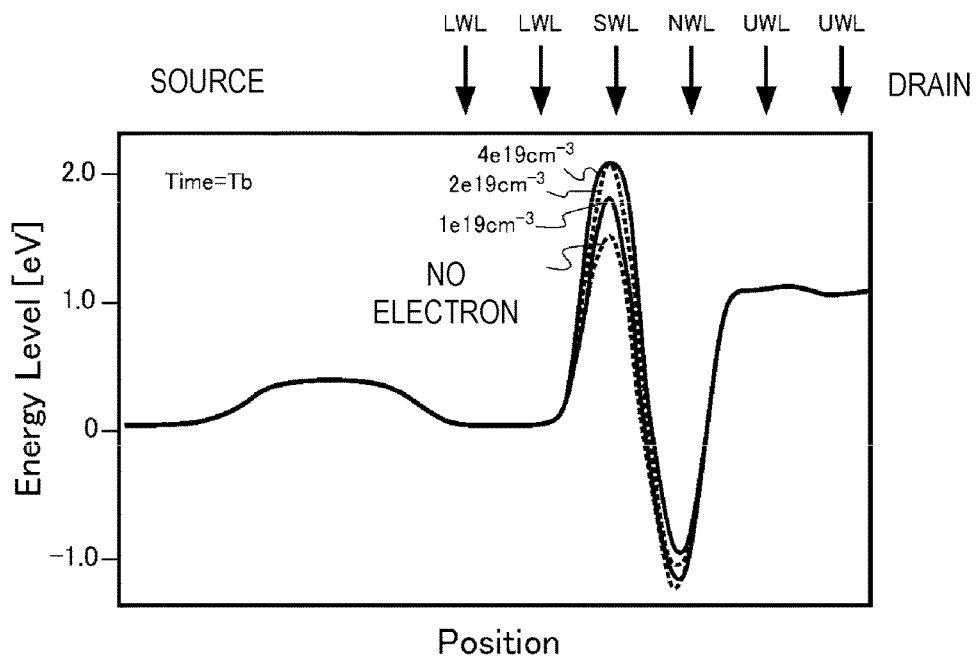

FIGS. 8A and 8B are explanatory views of an operation and an effect of the first embodiment. FIGS. 8A and 8B illustrate a change of an energy level of a conduction band lower end when the density of electrons accumulated in a charge storage region is changed. FIG. 8A illustrates an energy level at time Ta in the precharge step, and FIG. 8B illustrates an energy level of the conduction band lower end at time Tb in the off step.

As illustrated in FIG. 8A, it can be found that as an electron density increases from no electrons to $1 \times 10^{19}$ cm$^{-3}$, $2 \times 10^{19}$ cm$^{-3}$, and $4 \times 10^{19}$ cm$^{-3}$, an energy barrier with respect to electrons just below a selected word line SWL rises. However, in FIG. 8B, it can be found that when the electron density exceeds $2 \times 10^{19}$ cm$^{-3}$, the height of the energy barrier with respect to electrons just below the selected word line SWL becomes constant.

Under the same conditions of an electron density as those in FIGS. 8A and 8B, a simulation was performed on a threshold voltage of a memory cell transistor MT. The threshold voltage of the memory cell transistor MT was saturated when the electron density exceeded $2 \times 10^{19}$ cm$^{-3}$.

As illustrated in FIGS. 8A and 8B, it is considered that the height of an energy barrier with respect to electrons just below a selected word line SWL is saturated at an electron density exceeding a certain density, resulting in a saturation of a rise of a threshold voltage.

Figure 9:
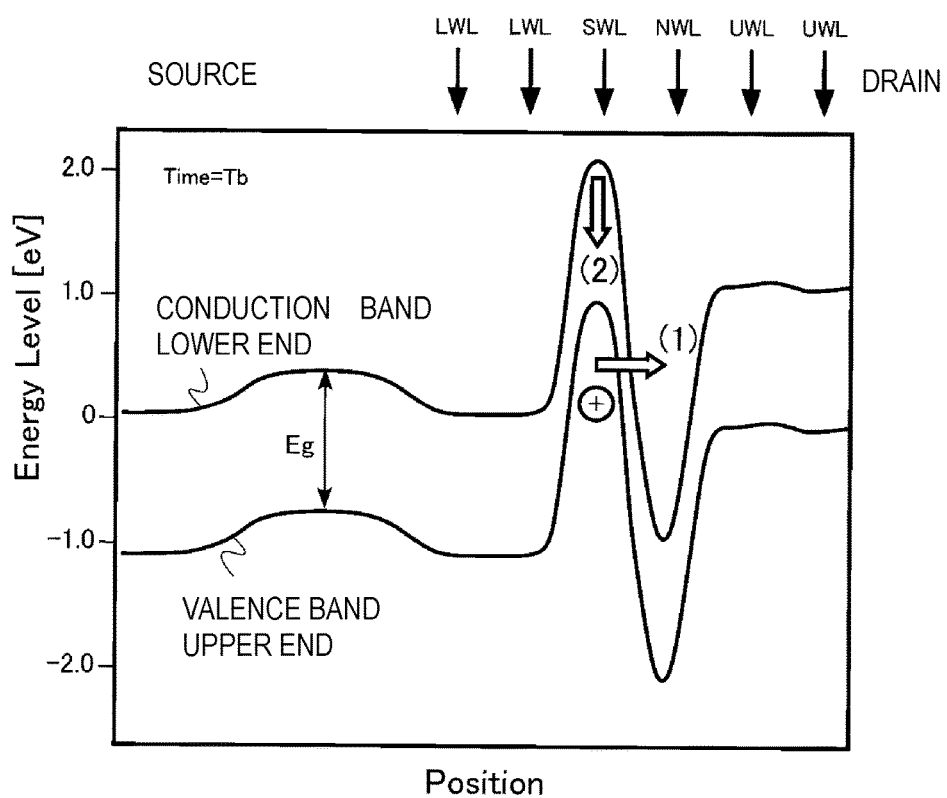
FIG. 9 is an explanatory view of an operation and an effect of the first embodiment.

FIG. 9 is an explanatory view of an operation and an effect of the first embodiment. FIG. 9 illustrates energy levels of a conduction band lower end and a valence band upper end at time Tb in the off step.

When an off voltage Voff as a negative voltage is applied to a selected word line SWL in the off step, an energy barrier with respect to electrons just below the selected word line SWL rises. That is, an energy level of a conduction band lower end just below the selected word line SWL rises. Here, an energy level of a valence band upper end just below the selected word line SWL also rises. As a result, as illustrated in FIG. 9, a conduction band lower end just below an adjacent word line NWL and a valence band upper end just below the selected word line SWL come close to each other, and thus a band to band tunneling of holes may occur (the arrow (1) in FIG. 9).

When the band to band tunneling of holes occurs, the energy barrier with respect to electrons just below the selected word line SWL is lowered (the arrow (2) in FIG. 9). Accordingly, a threshold voltage of a memory cell transistor MT is lowered. The band to band tunneling of holes is likely to occur as the energy level of the conduction band lower end just below the selected word line SWL prior to application of the off voltage Voff increases. That is, as the amount of electrons accumulated in a charge storage region increases, a band to band tunneling of holes is more likely to occur.

When the off voltage Voff is set to be low, an increase of the energy level of the conduction band lower end just below the selected word line SWL is prevented. Therefore, by setting the off voltage Voff to be low, the band to band tunneling of holes may be prevented.

Meanwhile, when the off voltage Voff is set to be low, there is a concern that the energy barrier with respect to electrons just below the selected word line SWL may be lowered, resulting in an increase of a leakage current between a drain and a source. When the leakage current increases, a problem occurs in that measurement of a threshold voltage becomes more difficult in a memory cell transistor with a low threshold voltage.

In the method of controlling the semiconductor memory device according to the first embodiment, data reading is performed twice for the same memory cell transistor MT. Two data readings, that is, a first read sequence and a second read sequence, are performed. The data readings are performed using different values for off voltage Voff. Thus, a true value of data of the memory cell transistor MT may be obtained.

Figure 10A:
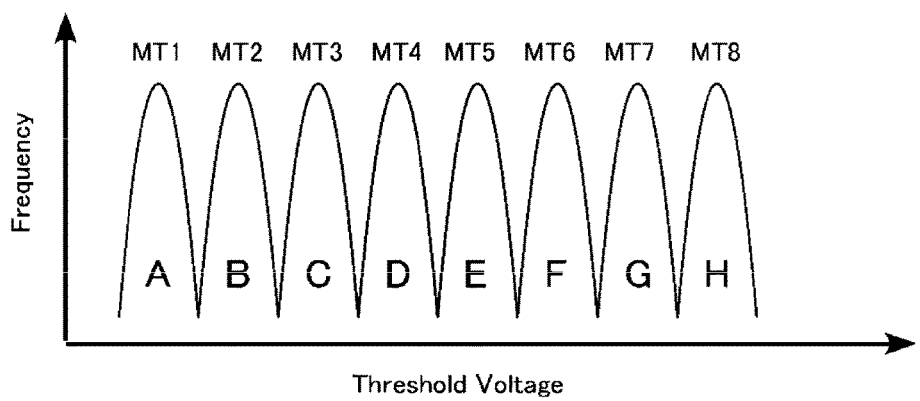
FIGS. 10A to 10C are explanatory views of an operation and effect of the first embodiment.
Figure 10B:
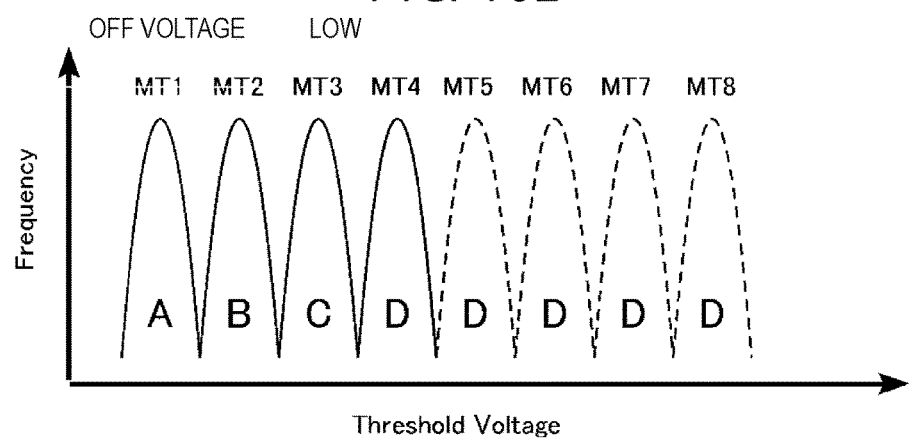
Figure 10C:
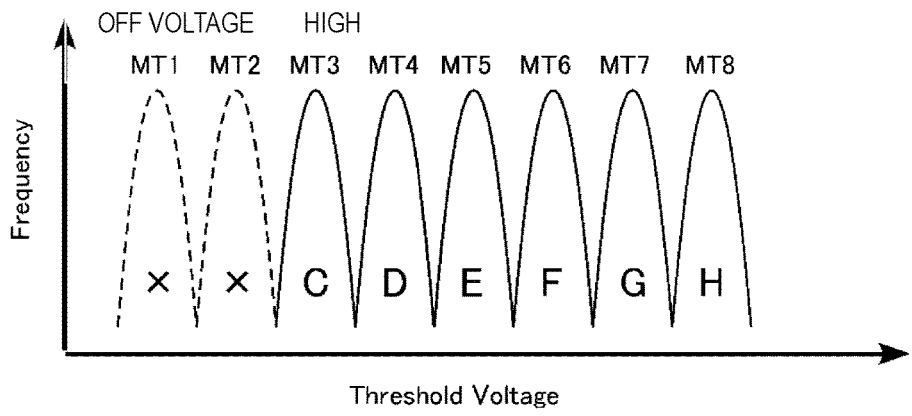

FIGS. 10A to 10C are explanatory views of an operation and an effect of the first embodiment. FIGS. 10A to 10C illustrate a distribution of threshold voltages of a memory cell transistor MT. FIGS. 10A to 10C illustrate a case where the three-dimensional NAND flash memory stores eight values, as an example. The memory cell transistor is capable of storing A to H eight threshold voltages as different data. The threshold voltage value rises from a threshold voltage A toward a threshold voltage H.

In FIGS. 10A to 10C, for example, it is assumed that a memory cell transistor MT1 stores a threshold voltage A, a memory cell transistor MT2 stores a threshold voltage B, a memory cell transistor MT3 stores a threshold voltage C, a memory cell transistor MT4 stores a threshold voltage D, a memory cell transistor MT5 stores a threshold voltage E, a memory cell transistor MT6 stores a threshold voltage F, a memory cell transistor MT7 stores a threshold voltage G, and a memory cell transistor MT8 stores a threshold voltage H, as data.

FIG. 10A illustrates read data of each memory cell transistor MT in a case where it is assumed that there is no band to band tunneling of holes. FIG. 10B illustrates read data of each memory cell transistor MT at a low Voff in a case where it is assumed that there is a band to band tunneling of holes. FIG. 10C illustrates read data of each memory cell transistor MT at a high Voff in a case where it is assumed that there is a band to band tunneling of holes. For example, FIG. 10B corresponds to read data in the first read sequence, and FIG. 10C corresponds to read data in the second read sequence.

When the memory cell transistor MT is capable of storing A to H eight threshold voltages as different data, for example, in a read step of data, different levels of read voltages Vread are applied in stages. By applying the different levels of read voltages Vread in stages, a magnitude of a threshold voltage of the memory cell transistor MT may be determined.

When it is assumed that there is no band to band tunneling of holes, as illustrated in FIG. 10A, for the memory cell transistors MT1 to MT8, true values as threshold voltages are always obtained.

When there is an influence of a band to band tunneling of holes, and a Voff is low, as illustrated in FIG. 10B, for the memory cell transistors MT5 to MT8 with high threshold voltages, true values are not obtained. That is, the threshold voltage is saturated due to the band to band tunneling of holes, and each of threshold voltages of the memory cell transistors MT5 to MT8 becomes a threshold voltage D.

When there is an influence of a band to band tunneling of holes, and a Voff is high, as illustrated in FIG. 10C, for the memory cell transistors MT1 and MT2 with low threshold voltages, true values are not obtained due to an influence of a leakage current. Meanwhile, the band to band tunneling of holes is prevented, and for threshold voltages of the memory cell transistors MT3 to MT8, true values are obtained.

In the method of controlling the semiconductor memory device according to the first embodiment, first data obtained in the first read sequence and second data obtained in the second read sequence with a different off voltage Voff are stored, and compared to each other, and then a true value of data is determined. For example, for the memory cell transistors MT1 to MT8, data with a higher threshold voltage is determined as a true value, so that true values of data in the memory cell transistors MT1 to MT8 may be obtained.

In the first embodiment, in particular, a case where a selected word line SWL is the word line WL3 in FIG. 3 is described as an example, but the read operation may be similarly performed for a case where the selected word line SWL is a word line other than the word line WL3 as well.

In the first embodiment, a case where the number of memory cell transistors MT in a memory string MS is six is described as an example, but the number of memory cell transistors MT may be less than six or seven or more.

A dummy word line not functioning as a control electrode of a memory cell transistor MT may be provided, for example, between the word line WL1 and the source select gate line SGS, or between the word line WL6 and the drain select gate line SGD.

In the first embodiment, descriptions are made, as an example, on a case where a read sequence is performed twice for the same memory cell transistor MT, and read data obtained from the two read sequences are compared to each other, but it is also possible to obtain a true value by performing three or more read sequences at different off voltages Voff, and comparing read data obtained from the three or more read sequences to each other.

In the first embodiment, a case where the second off voltage Voff2 is higher than the first off voltage Voff1 is described as an example, but it is also possible to set the second off voltage Voff2 to be lower than the first off voltage Voff1.

In the first embodiment, a case where the same voltage is applied to the word line WL1 and the word line WL2 is described as an example. However, in order to adjust, for example, the height of an energy barrier with respect to electrons, it is also possible to apply a voltage different from that of the word line WL1, to the word line WL2 close to the selected word line SWL.

In the first embodiment, a case where the same voltage is applied to the word line WL5 and the word line WL6 is described as an example. However, in order to adjust, for example, the height of an energy barrier with respect to holes, it is also possible to apply a voltage different from that of the word line WL6, to the word line WL5 close to the adjacent word line NWL.

As described above, according to the first embodiment, it is possible to determine a true value of data by performing a plurality of read sequences at different off voltages Voff and comparing the read data obtained from the two read sequences to each other. Therefore, the width of readable threshold voltages is widened. Thus, a semiconductor memory device in which a read characteristic is improved, is achieved.

Second Embodiment

A semiconductor memory device according to a second embodiment includes a first conductive layer, a second conductive layer on the first conductive layer, an n-type semiconductor region, a p-type semiconductor region, and a semiconductor layer that extends through the first conductive layer and the second conductive layer, is provided between the n-type semiconductor region and the p-type semiconductor region, and has an n-type impurity concentration lower than an n-type impurity concentration of the n-type semiconductor region and a p-type impurity concentration lower than a p-type impurity concentration of the p-type semiconductor region. The semiconductor memory device according to the second embodiment is different from that in the first embodiment in that a charge storage region is not provided.

Figure 11:
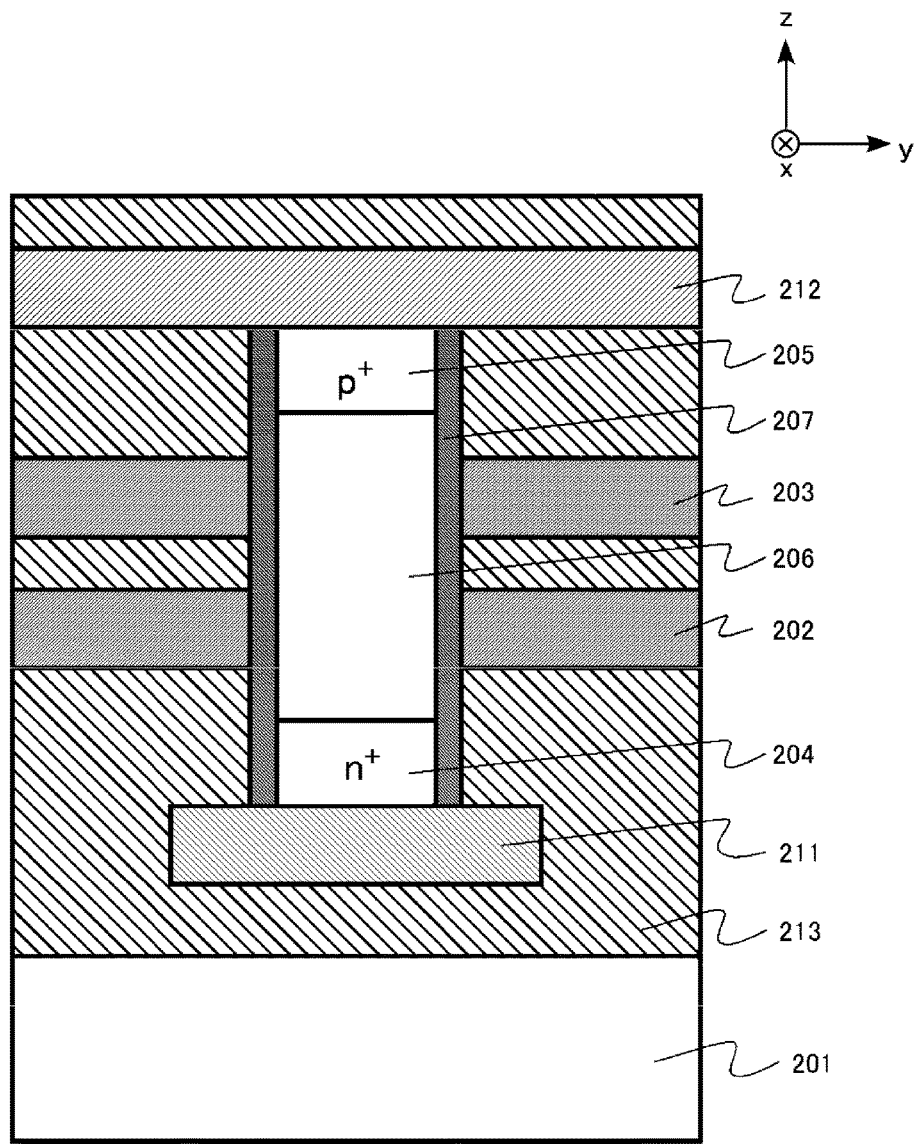
FIG. 11 is a schematic sectional view of a memory cell MC in a semiconductor memory device according to a second embodiment.
Figure 12:
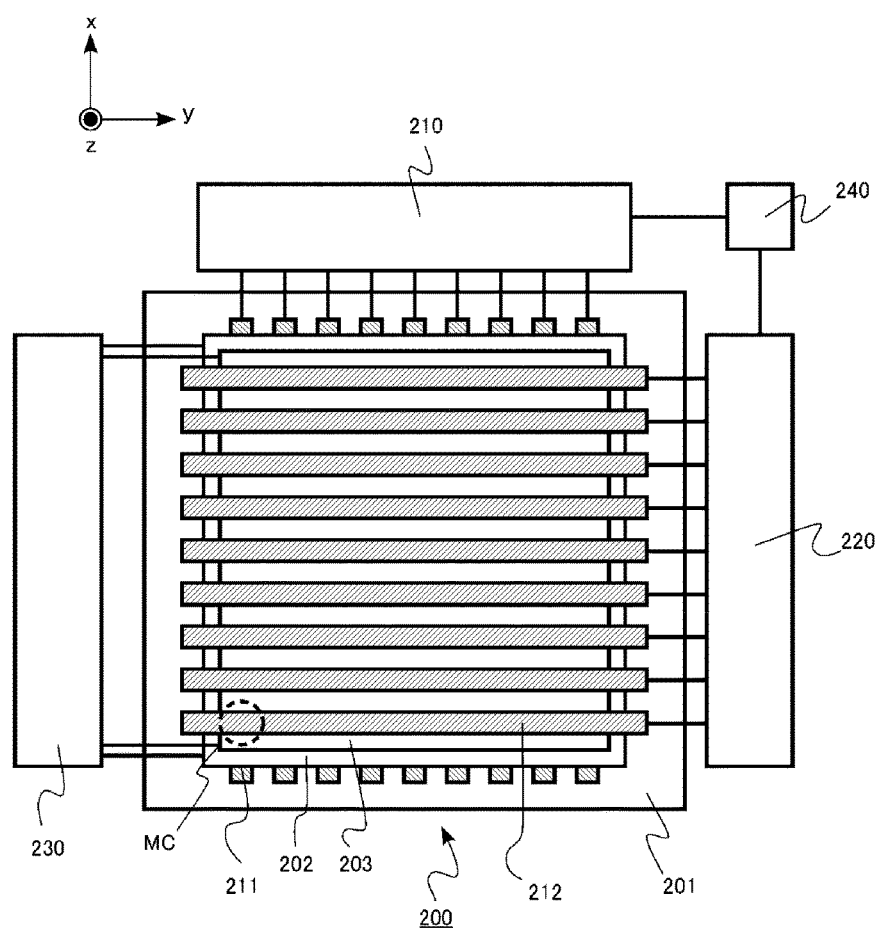
FIG. 12 is a block diagram of the semiconductor memory device according to the second embodiment.

FIG. 11 is a schematic sectional view of a memory cell MC in a semiconductor memory device according to the second embodiment. FIG. 12 is a block diagram of the semiconductor memory device according to the second embodiment. FIG. 11 illustrates a section of one memory cell MC, the section being indicated by a dotted circle in a memory cell array 200 in FIG. 12.

The semiconductor memory device according to the second embodiment includes the memory cell array 200, a first control circuit 210, a second control circuit 220, a third control circuit 230, and a sense circuit 240. The memory cell array 200 includes a semiconductor substrate 201, a first control electrode 202, a second control electrode 203, an n-type semiconductor region 204, a p-type semiconductor region 205, a semiconductor layer 206, a gate insulating layer 207, a plurality of word lines 211, a plurality of bit lines 212, and an interlayer insulating layer 213.

A plurality of memory cells MC are provided in a region where the word lines 211 and the bit lines 212 intersect. The semiconductor memory device according to the second embodiment is a dynamic random access memory (DRAM) having a cross point structure. The DRAM according to the second embodiment writes data in the memory cell MC by a thyristor operation.

Each of the plurality of word lines 211 is connected to the first control circuit 210. Each of the plurality of bit lines 212 is connected to the second control circuit 220. The first control electrode 202 and the second control electrode 203 are connected to the third control circuit 230. The sense circuit 240 is connected to the first control circuit 210 and the second control circuit 220.

The first control circuit 210 and the second control circuit 220 have functions of, for example, selecting a desired memory cell MC, and performing writing of data to the memory cell MC, and reading, erasing, or the like of data from the memory cell MC. At the time of data reading, data of the memory cell MC is read by an amount of current flowing between the word line 211 and the bit line 212. The sense circuit 240 has a function of determining the current amount, and determining a polarity of data. For example, determination on "0" and "1" of data is made.

The third control circuit 230 controls a voltage applied to the first control electrode 202 and the second control electrode 203.

The first control circuit 210, the second control circuit 220, the third control circuit 230, and the sense circuit 240 includes, for example, electronic circuits using semiconductor devices formed on the semiconductor substrate 201.

The semiconductor substrate 201 is, for example, a single crystal p-type silicon substrate. The semiconductor substrate 201 contains, for example, boron (B) as a p-type impurity.

The first control electrode 202 and the second control electrode 203 are provided on the semiconductor substrate 201. The first control electrode 202 and the second control electrode 203 are plate-shaped conductive layers. The interlayer insulating layer 213 is provided between the semiconductor substrate 201 and the first control electrode 202, and between the first control electrode 202 and the second control electrode 203.

The first control electrode 202 and the second control electrode 203 are made of polycrystalline silicon containing, for example, a conductive impurity. The first control electrode 202 and the second control electrode 203 may also be made of, for example, a metal. The interlayer insulating layer 213 is made of, for example, silicon oxide.

The n-type semiconductor region 204 contains an n-type impurity. The n-type semiconductor region 204 is provided between the semiconductor layer 206 and the word line 211. The n-type impurity is, for example, phosphorous (P) or arsenic (As). The n-type impurity concentration of the n-type semiconductor region 204 is, for example, $1 \times 10^{19}$ cm$^{-3}$ or more.

The p-type semiconductor region 205 contains a p-type impurity. The p-type semiconductor region 205 is provided between the semiconductor layer 206 and bit line 212. The p-type semiconductor region 205 is made of polycrystalline silicon containing, for example, a p-type impurity. The p-type impurity is, for example, boron (B). The p-type impurity concentration of the p-type semiconductor region 205 is, for example, $1 \times 10^{19}$ cm$^{-3}$ or more.

The semiconductor layer 206 is provided between the n-type semiconductor region 204 and the p-type semiconductor region 205. The semiconductor layer 206 is in contact with the n-type semiconductor region 204 and the p-type semiconductor region 205. The semiconductor layer 206 extends through the first control electrode 202 and the second control electrode 203. The semiconductor layer 206 extends in the z direction. The semiconductor layer 206 has, for example, a columnar shape or a cylindrical shape. The semiconductor layer 206 is surrounded by the first control electrode 202 and the second control electrode 203.

The semiconductor layer 206 is made of, for example, polycrystalline silicon. The n-type impurity concentration of the semiconductor layer 206 is lower than the n-type impurity concentration of the n-type semiconductor region 204. The p-type impurity concentration of the semiconductor layer 206 is lower than the p-type impurity concentration of the p-type semiconductor region 205. The n-type impurity concentration and the p-type impurity concentration of the semiconductor layer 206 are, for example, $1\times10^{16}$ cm$^{-3}$ or less. The semiconductor layer 206 is, for example, an intrinsic semiconductor.

The gate insulating layer 207 is provided between the first control electrode 202 and the semiconductor layer 206. The gate insulating layer 207 is provided between the second control electrode 203 and the semiconductor layer 206. The gate insulating layer 207 is made of, for example, silicon oxide.

The word line 211 is electrically connected to the n-type semiconductor region 204. The word line 211 is in contact with, for example, the n-type semiconductor region 204. The word line 211 is made of, for example, a metal.

The bit line 212 is electrically connected to the p-type semiconductor region 205. The bit line 212 is in contact with, for example, the p-type semiconductor region 205. The bit line 212 is made of, for example, a metal.

Figure 13:
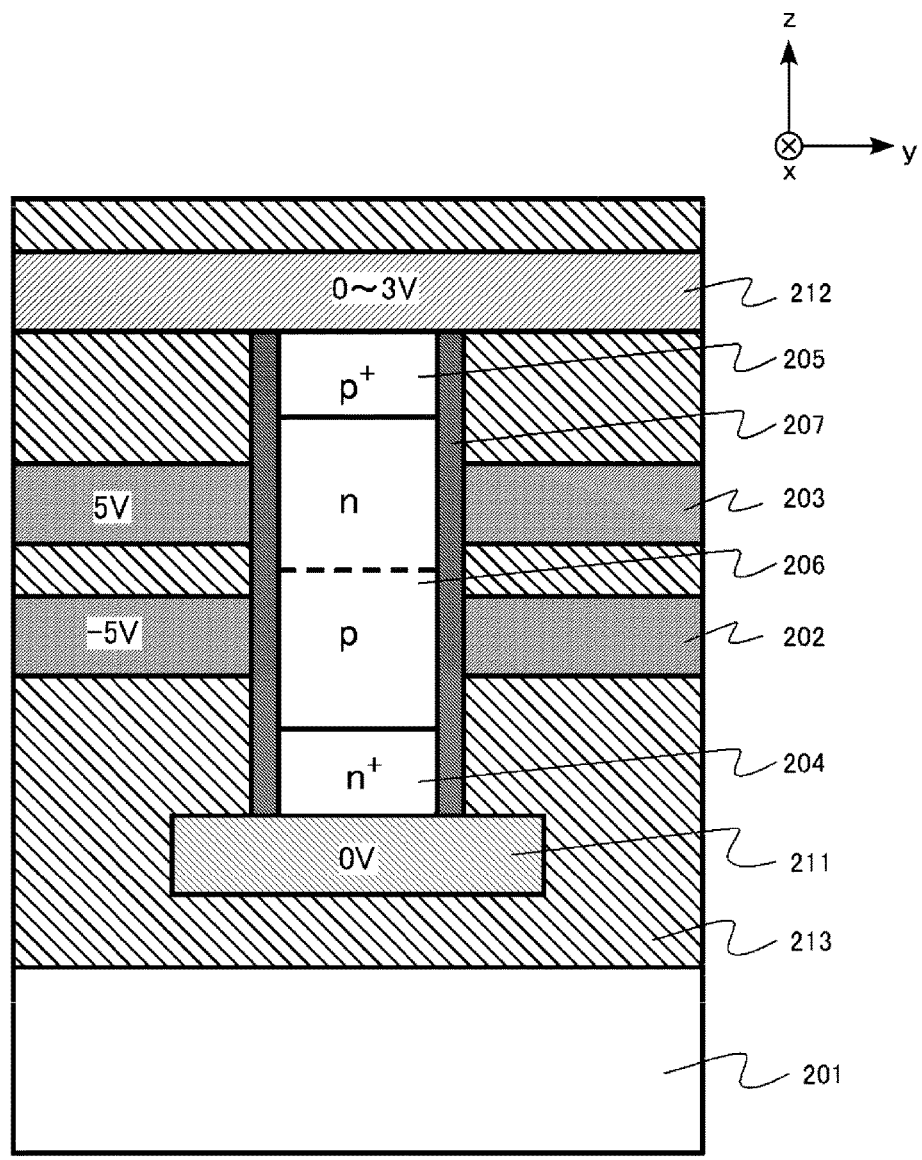
FIG. 13 is a schematic sectional view of the memory cell MC for explaining a basic operation of the semiconductor memory device according to the second embodiment.
Figure 14:
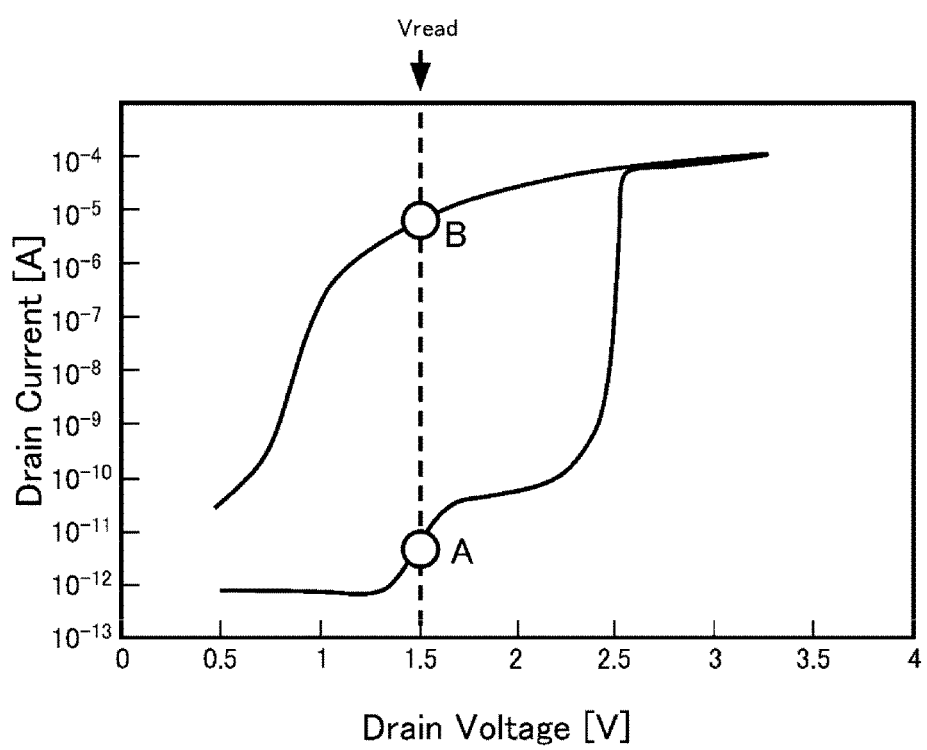
FIG. 14 is a graph of current-voltage characteristic for explaining a basic operation of the semiconductor memory device according to the second embodiment.

FIGS. 13 and 14 are explanatory views of a basic operation in the semiconductor memory device according to the second embodiment. FIG. 13 is a schematic sectional view illustrating an applied voltage and a state of the semiconductor layer 206, at the time of a write operation. FIG. 14 is a graph illustrating a relationship between a drain voltage and a drain current. The drain voltage is a voltage between the bit line 212 and the word line 211. The drain current is a current flowing between the bit line 212 and the word line 211.

At the time of the write operation, for example, 0 V, −5 V, and 5 V are applied to the word line 211, the first control electrode 202, and the second control electrode 203, respectively. Holes are accumulated in the semiconductor layer 206 facing the first control electrode 202, and thus a p-type semiconductor is obtained. Electrons are accumulated in the semiconductor layer 206 facing the second control electrode 203, and thus an n-type semiconductor is obtained. Thus, a thyristor structure of npnp is formed within the semiconductor layer 206 from the word line 211 toward the bit line 212.

At the time of the write operation, the bit line 212 transitions from 0 V to 3 V. As a result, the drain voltage transitions from 0 V to 3 V. As illustrated in FIG. 14, when the drain voltage reaches a certain value, a thyristor operation occurs, and the drain current rapidly increases.

After the thyristor operation occurs, a state where the drain current is high is maintained for a predetermined time. Accordingly, by setting, for example, Vread to 1.5 V, two current states, that is, a low current state (the point A in FIG. 14) and a high current state (the point B in FIG. 14), may be read. By using the two current states, the semiconductor memory device according to the second embodiment functions as a binary DRAM.

According to the semiconductor memory device of the second embodiment, it is possible to achieve a DRAM with a small memory cell size. For example, it is possible to achieve a DRAM with a large memory capacity by stacking memory cell arrays in the three-dimensional direction (the z direction).

In FIG. 11, a case where one first control electrode 202 and one second control electrode 203 are provided is described as an example, but it is also possible to provide a plurality of first control electrodes 202 and a plurality of second control electrodes 203.

As described above, according to the semiconductor memory device of the second embodiment, it is possible to easily achieve a DRAM with a small memory cell size, and a large memory capacity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
an n-type semiconductor region;
a first conductive layer above the n-type semiconductor region;
a second conductive layer above the first conductive layer;
a third conductive layer above the second conductive layer;
a fourth conductive layer above the third conductive layer;
a p-type semiconductor region closer to the fourth conductive layer than the n-type semiconductor region;
a semiconductor layer that extends through the first conductive layer, the second conductive layer, the third conductive layer, and the fourth conductive layer, is between the n-type semiconductor region and the p-type semiconductor region, and has an n-type impurity concentration lower than an n-type impurity concentration of the n-type semiconductor region and a p-type impurity concentration lower than a p-type impurity concentration of the p-type semiconductor region;
a first charge storage region between the first conductive layer and the semiconductor layer;
a second charge storage region between the second conductive layer and the semiconductor layer;
a third charge storage region between the third conductive layer and the semiconductor layer;
a fourth charge storage region between the fourth conductive layer and the semiconductor layer;
a voltage control circuit configured to control voltages to be applied to the first conductive layer, the second conductive layer, the third conductive layer, and the fourth conductive layer, and to execute a first read sequence in which first data based on a charge amount in the second charge storage region is read, and a second read sequence, following the first read sequence, in which second data based on a charge amount in the second charge storage region is read;
a comparison circuit configured to compare the first data to the second data; and
a determination circuit configured to select one of the first data and the second data as a true read value based on a comparison result of the comparison circuit,
wherein each of the first read sequence and the second read sequence has an off step during which an off voltage is applied to the second conductive layer, and a read step during which a read voltage higher than the off voltage is applied to the second conductive layer, and the off voltage of the first read sequence and the off voltage of the second read sequence are different.

2. The semiconductor memory device according to claim 1, further comprising:
a first memory that stores the first data; and
a second memory that stores the second data,
wherein the comparison circuit compares the first data stored in the first memory and the second data stored in the second memory.

3. The semiconductor memory device according to claim 2, wherein the first data and the second data are threshold voltages of a memory cell transistor that is formed by the second conductive layer, the second charge storage region, and the semiconductor layer.

4. The semiconductor memory device according to claim 1, further comprising:
a voltage generation circuit configured to generate the off voltages applied during the first read sequence and the second read sequence.

5. The semiconductor memory device according to claim 4, wherein at least one of the off voltages is a positive voltage.

6. The semiconductor memory device according to claim 1, wherein
during the off step, a positive voltage is applied to the first conductive layer and the third conductive layer, and a negative voltage is applied to the fourth conductive layer.

7. The semiconductor memory device according to claim 1, wherein
during the read step, a positive voltage is applied to the first conductive layer, the third conductive layer, and the p-type semiconductor region, and a negative voltage is applied to the fourth conductive layer.

8. The semiconductor memory device according to claim 1, further comprising:
insulating layers between the first conductive layer and the second conductive layer, between the second conductive layer and the third conductive layer, and between the third conductive layer and the fourth conductive layer.

9. The semiconductor memory device according to claim 1, further comprising:
a fifth conductive layer between the first conductive layer and the second conductive layer; and
a sixth conductive layer between the third conductive layer and the fourth conductive layer.

10. The semiconductor memory device according to claim 1, wherein the semiconductor layer is made of polycrystalline silicon.

11. A method of performing a read operation on a semiconductor memory device comprising an n-type semiconductor region, a first conductive layer above the n-type semiconductor region, a second conductive layer above the first conductive layer, a third conductive layer above the second conductive layer, a fourth conductive layer above the third conductive layer, a p-type semiconductor region closer to the fourth conductive layer than the n-type semiconductor region, a semiconductor layer between the n-type semiconductor region and the p-type semiconductor region, extending through the first, second, third, and fourth conductive layers, and having an n-type impurity concentration lower than an n-type impurity concentration of the n-type semiconductor region and a p-type impurity concentration lower than a p-type impurity concentration of the p-type semiconductor region, a first charge storage region between the first conductive layer and the semiconductor layer, a second charge storage region between the second conductive layer and the semiconductor layer, a third charge storage region between the third conductive layer and the semiconductor layer, and a fourth charge storage region between the fourth conductive layer and the semiconductor layer, said method comprising:
executing a first read sequence in which first data based on a charge amount in the second charge storage region is read, and a second read sequence, following the first read sequence, in which second data based on a charge amount in the second charge storage region is read;
comparing the first data to the second data; and
selecting one of the first data and the second data as a true read value based on a comparison result of the comparison circuit,
wherein each of the first read sequence and the second read sequence has an off step during which an off voltage is applied to the second conductive layer, and a read step during which a read voltage higher than the off voltage is applied to the second conductive layer, and the off voltage of the first read sequence and the off voltage of the second read sequence are different.

12. The method according to claim 11, further comprising:
prior to said comparing, storing the first data in a first memory and storing the second data in a second memory.

13. The method according to claim 12, wherein the first data and the second data are threshold voltages of a memory cell transistor that is formed by the second conductive layer, the second charge storage region, and the semiconductor layer.

14. The method according to claim 11, further comprising:
generating the off voltages applied during the first read sequence and the second read sequence.

15. The method according to claim 14, wherein at least one of the off voltages is a positive voltage.

16. The method according to claim 11, further comprising:
during the off step, applying a positive voltage to the first conductive layer and the third conductive layer, and a negative voltage to the fourth conductive layer.

17. The method according to claim 11, further comprising:
during the read step, applying a positive voltage to the first conductive layer, the third conductive layer, and the p-type semiconductor region, and a negative voltage to the fourth conductive layer.

18. The method according to claim 11, wherein the semiconductor memory device further comprises:
insulating layers between the first conductive layer and the second conductive layer, between the second conductive layer and the third conductive layer, and between the third conductive layer and the fourth conductive layer.

19. The method according to claim 11, wherein the semiconductor memory device further comprises:
a fifth conductive layer between the first conductive layer and the second conductive layer; and
a sixth conductive layer between the third conductive layer and the fourth conductive layer.

20. The method according to claim 11, wherein the semiconductor layer is made of polycrystalline silicon.

* * * * *